(12) United States Patent
La Rosa

(10) Patent No.: US 8,036,020 B2
(45) Date of Patent: Oct. 11, 2011

(54) CIRCUIT FOR READING A CHARGE RETENTION ELEMENT FOR A TIME MEASUREMENT

(75) Inventor: Francesco La Rosa, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/374,794

(22) PCT Filed: Jul. 20, 2007

(86) PCT No.: PCT/FR2007/051700
§ 371 (c)(1),
(2), (4) Date: Oct. 27, 2009

(87) PCT Pub. No.: WO2008/012462
PCT Pub. Date: Jan. 31, 2008

(65) Prior Publication Data
US 2010/0054024 A1    Mar. 4, 2010

(30) Foreign Application Priority Data

Jul. 27, 2006  (FR) ..................................... 06 53136

(51) Int. Cl.
*G11C 11/24* (2006.01)
(52) U.S. Cl. ................ 365/149; 365/189.15; 365/207
(58) Field of Classification Search .................. None
See application file for complete search history.

(56) References Cited

U.S. PATENT DOCUMENTS

| | | | |
|---|---|---|---|
| 3,919,699 A | 11/1975 | Hideshima | |
| 5,363,325 A * | 11/1994 | Sunouchi et al. | 365/149 |
| 5,508,958 A | 4/1996 | Fazio et al. | |
| 5,525,820 A | 6/1996 | Furuyama | |
| 5,973,959 A | 10/1999 | Gerna et al. | |
| 6,081,448 A * | 6/2000 | Pasotti et al. | 365/185.03 |
| 6,185,125 B1 | 2/2001 | Yang | |

(Continued)

FOREIGN PATENT DOCUMENTS

EP    1473736 A2    11/2004

(Continued)

OTHER PUBLICATIONS

International Search Report completed Jan. 16, 2008 from corresponding International Application No. PCT/FR2007/051700.

(Continued)

*Primary Examiner* — Tan T. Nguyen
(74) *Attorney, Agent, or Firm* — Lisa K. Jorgenson; Wolf, Greenfield & Sacks, P.C.; James H. Morris

(57) ABSTRACT

A method and a circuit for reading an electronic charge retention element for a temporal measurement, of the type including at least one capacitive element whose dielectric exhibits a leakage and a transistor with insulated control terminal for reading the residual charges, the reading circuit including; two parallel branches between two supply terminals, each branch including at least one transistor of a first type and one transistor of a second type, the transistor of the second type of one of the branches consisting of that of the element to be read and the transistor of the second type of the other branch receiving, on its control terminal, a staircase signal, the respective drains of the transistors of the first type being connected to the respective inputs of a comparator whose output provides an indication of the residual voltage in the charge retention element.

24 Claims, 8 Drawing Sheets

U.S. PATENT DOCUMENTS

| | | | |
|---|---|---|---|
| 6,885,574 B2 * | 4/2005 | Torrisi et al. | 365/145 |
| 7,646,635 B2 * | 1/2010 | Chen et al. | 365/171 |
| 2002/0149964 A1 | 10/2002 | Campardo et al. | |
| 2005/0135411 A1 | 6/2005 | Sureaud | |
| 2005/0259488 A1 | 11/2005 | Solo de Zaldivar et al. | |
| 2006/0196933 A1 | 9/2006 | Tomoeda et al. | |

FOREIGN PATENT DOCUMENTS

| | | |
|---|---|---|
| FR | 2 814 583 A | 3/2002 |
| WO | WO 9506905 A | 3/1995 |

OTHER PUBLICATIONS

International Search Report completed Jan. 16, 2008 from International Application No. PCT/FR2007/051701.

International Search Report completed Jan. 16, 2008 from International Application No. PCT/FR2007/051696.

International Search Report completed Jan. 16, 2008 from International Application No. PCT/FR2007/0516705.

* cited by examiner

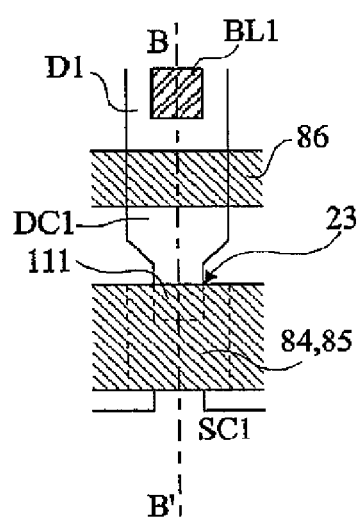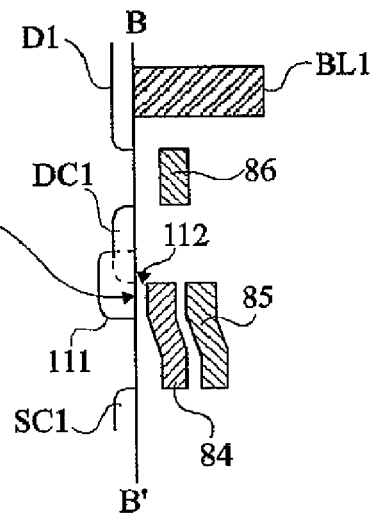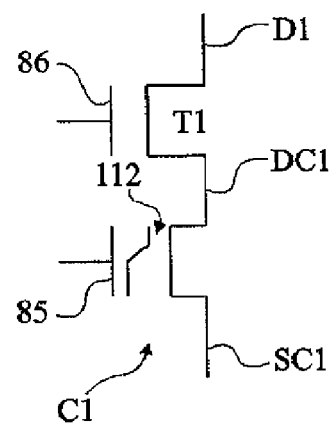
Fig 11A Fig 11B Fig 11C
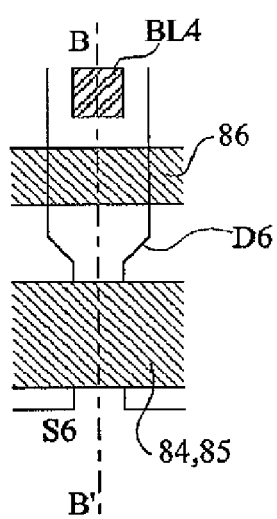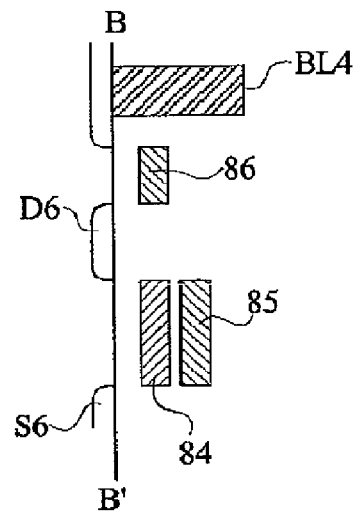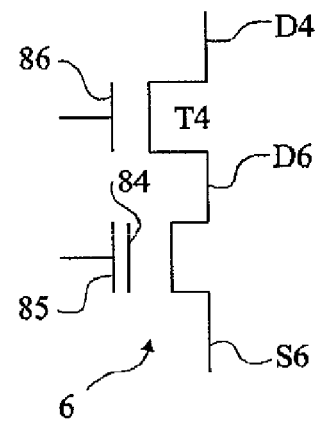
Fig 12A Fig 12B Fig 12C

CIRCUIT FOR READING A CHARGE RETENTION ELEMENT FOR A TIME MEASUREMENT

BACKGROUND OF THE INVENTION

1. Field of the Invention

The present invention generally relates to electronic circuits and, more specifically, to the forming of a circuit enabling controllably storing electric charges for a time measurement.

2. Discussion of the Related Art

In many applications, it is desired to have data representative of a time elapsed between two events, be it an accurate or approximate measurement. An example of application relates to the time management of rights of access, especially to media.

The obtaining of such data representative of the elapsed time conventionally requires a time measurement by an electronic circuit powered, for example by means of a battery, to avoid losing the history of the data when the circuit is not used.

It would be desirable for a time measurement which operates even when the electronic measurement circuit is not powered to be available.

International patent WO-A-03/083769 describes a time-measurement secured transactional electronic entity in which the time elapsed between two successive transactions is determined by measuring the charge of a capacitive component exhibiting a leakage from its dielectric spacer. The component is charged when the circuit is powered and its residual charge, after interruption of the power supply, is measured when the circuit is powered back on. This residual charge is considered as representative of the time elapsed between the two circuit-powering times.

The electronic entity is based on a MOS transistor having its gate connected to a first electrode of a capacitive component which has its other electrode grounded along with the transistor source. The transistor drain is connected to a power supply voltage by means of a current-to-voltage conversion resistor. The voltage measured across the resistor is a function of the drain current in the transistor, and thus of its gate-source voltage, hence of the voltage across the capacitive component. A time interval is initialized by charging the capacitive component by application of an electric power source on its electrode common with the transistor gate.

The solution provided by this document has several disadvantages.

First, the measurable time range is limited by the possibilities of intervention on the capacitive component dielectric.

Then, the charge of the capacitive component generates an electric stress on its dielectric, whereby the measurements drift along time.

Further, the provided structure requires forming of a specific component. In certain applications, it would be desirable to associate the time measurement element with a memory to condition the access to the data or programs contained in this memory. The known solution of the above-mentioned document is not easily compatible with the memory manufacturing steps.

Further, the interpretation of the residual charge in the capacitive component requires calibration steps to generate charge-to-time conversion tables.

SUMMARY OF THE INVENTION

At least one embodiment of the present invention aims at overcoming all or part of the disadvantages of known solutions to provide data representative of a time elapsed between two events, without it being necessary to permanently power the electronic circuit containing the means to achieve this.

According to a first aspect, at least one embodiment of the present invention aims at an electronic circuit of charge retention for a time measurement.

According to a second aspect, at least one embodiment of the present invention aims at the forming of such a circuit in a way compatible with technologies used to form memory cells.

According to a third aspect, at least one embodiment of the present invention aims at the reading from an electronic charge retention circuit without the constraint of a table for converting a residual charge value into a time interval.

According to a fourth aspect, at least one embodiment of the present invention aims at a fast programming of an electronic charge retention circuit.

To achieve all or part of these objects, as well as others, at least one embodiment of the present invention provides a circuit for reading from an electronic charge retention element for a time measurement, of the type comprising at least one capacitive element with a dielectric having a leakage and a transistor with an isolated control terminal for reading residual charges, the read circuit comprising:

two parallel branches between two power supply terminals, each branch comprising at least one transistor of a first type and one transistor of a second type, the transistor of the second type of one of the branches being formed by that of the element to be read and the transistor of the second of the other branch receiving, on its control terminal, a stepped signal, the respective drains of the transistors of the first type being connected to the respective inputs of a comparator having its output providing an indication of the residual voltage level in the charge retention element.

According to an embodiment of the present invention, each branch comprises a second transistor of the second type having its control terminals connected at the output of an amplifier of application of a reference voltage, said voltage being also applied on a conduction terminal of the transistor of the charge retention element.

According to an embodiment of the present invention, a reference terminal of the capacitive element of the charge retention element to be read from is connectable to a reference terminal of a second reference charge retention element.

According to an embodiment of the present invention, said stepped signal is provided by a digital-to-analog converter of non-linear type.

The present invention also provides a method for calibrating a read circuit, in which a voltage reference value of the digital-to-analog converter corresponds to $Q(r)/(k*C_T)$, where k represents the maximum count of the converter, $Q(r)$ represents the initial charge of the retention circuit, and $C_T$ represents its capacitance.

The present invention also provides a method for calibrating a read circuit, in which a weighting coefficient of the count provided by the converter is deduced from an initial measurement from a known time interval.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 11A, 11B, and 11C respectively are a top view, a cross-section view along the second direction, and the equivalent electric diagram of a third element of the circuit of FIGS. 8A to 8C;

FIGS. 12A, 12B, and 12C respectively are a top view, a cross-section view along the second direction, and the equivalent electric diagram of a fourth element of the circuit of FIGS. 8A to 8C;

DETAILED DESCRIPTION

Figure 1:
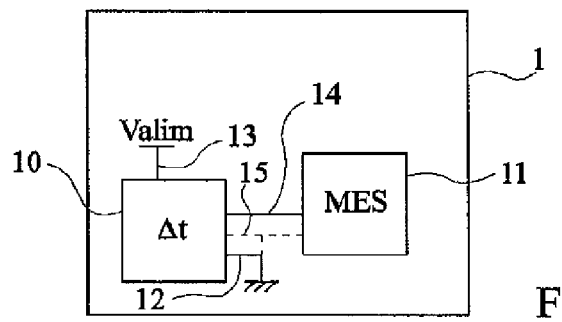
FIG. 1 is a schematic block diagram illustrating an electronic entity equipped with a charge retention circuit according to an aspect of the present invention.

The same elements have been designated with the same reference numerals in the different drawings which have been drawn out of scale. For clarity, only those elements useful to the understanding of the present invention have been shown and will be described. In particular, what use is made of the time data obtained by the circuit according to any of the aspects of the present invention has not been detailed, the present invention being compatible with any conventional exploitation of such time data. Similarly, the methods and elements at the origin of a programming or time countdown initialization have not been detailed, the present invention being here again compatible with any need for starting of a time countdown.

FIG. 1 is a schematic block diagram illustrating an electronic device 1 comprising an electronic charge retention circuit 10 according to any of the aspects of the present invention.

Device 1 is any electronic device capable of exploiting data representative of a time elapsed between two events. It is equipped with an electronic charge retention circuit 10 ($\Delta t$) controllable for a time measurement. Circuit 10 is likely to be submitted to a supply voltage Valim applied between two terminals 13 and 12, terminal 12 being connected to a reference voltage (for example, the ground). Voltage Valim is used to initialize a charge retention phase. Two terminals 14 and 15 of circuit 10 are intended to be connected to a measurement circuit 11 (MES) capable of converting data about a residual charge of an element of circuit 10 into data relative to the time elapsed between the retention phase initialization time and the measurement time. Terminal 15 may be used as a reference for the measurement and be grounded.

Circuit 10 is preferentially made in the form of an integrated circuit from a semiconductor substrate, for example, made of silicon.

Figure 2:
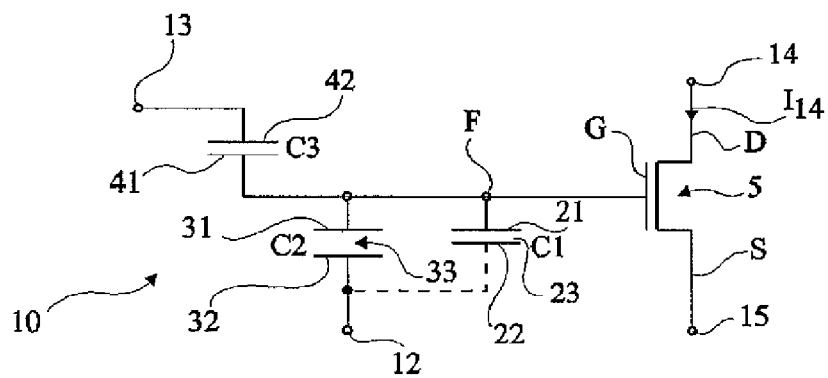
FIG. 2 shows an embodiment of an electronic charge retention circuit according to the first aspect of the present invention.

FIG. 2 shows the electric diagram of a first embodiment of a controllable charge retention circuit 10 according to the first aspect of the present invention.

Circuit 10 comprises a first capacitive element C1 having a first electrode 21 connected to a floating node F and having its dielectric spacer 23 designed (by its permittivity and/or by its thickness) to have leakages which are not negligible with time. "Floating node F" is used to designate a node which is not directly connected to any diffused region of the semiconductor substrate and, more specifically, which is separated by a dielectric spacer, from any voltage-application terminal. By default, second electrode 22 of capacitive element C1 is either connected (dotted lines in FIG. 2) to terminal 12 intended to be connected to a reference voltage, or left unconnected.

A second capacitive element C2 has a first electrode 31 connected to node F and a second electrode 32 connected to terminal 12. Dielectric spacer 33 of capacitive element C2 exhibits a charge retention capacitance greater than that of capacitive element C1.

Preferably, a third capacitive element C3 has a first electrode 41 connected to node F and a second electrode 42 connected to terminal 13 of the circuit, intended to be connected to a power source (for example, voltage Valim) on initialization of a charge retention phase.

A function of capacitive element C2 is to store an electric charge. A function of capacitive element C1 is to relatively slowly discharge storage element C2 (as compared with a direct grounding of its electrode 31) due to the leakage through its dielectric spacer. The presence of capacitive element C2 enables dissociating the charge level present in the circuit from the discharge element (capacitance C1). The thickness of the dielectric of element C2 is greater than that of element C1. The capacitance of element C2 is greater, preferably by a ratio of at least 10, than that of element C1.

A function of capacitive element C3 is to enable an injection of charges into capacitive element C2 by Fowler-Nordheim effect or by a hot electron injection phenomenon. Element C3 enables avoiding the stress on element C1 on charge of elements C2 and C1 in parallel. The thickness of the dielectric spacer of element C3 is greater than that of element C1, to avoid introducing a parasitic leakage path.

Node F is connected to a gate G of a transistor with an isolated control terminal (for example, a MOS transistor 5), having its conduction terminals (drain D and source S) connected to output terminals 14 and 15 to measure the residual charge contained in element C2 (neglecting the capacitance of element C1 in parallel). For example, terminal 15 is grounded and terminal 14 is connected to a current source enabling current-to-voltage conversion of drain current $I_{14}$ in transistor 5.

The thickness of the gate dielectric of transistor 5 is greater than that of the dielectric of element C1 to avoid introducing an additional leakage on node F. Preferably, the gate thickness of transistor 5 is even greater than the thickness of the dielectric of element C3, to avoid introducing a parasitic programming path (of injection or extraction of charges into and from node F).

Figure 3:
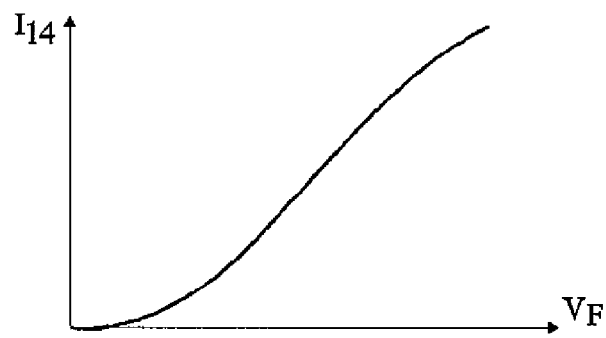
FIG. 3 is a current-vs.-voltage graph illustrating the operation of the circuit of FIG. 2.

FIG. 3 shows an example of the shape of drain current $I_{14}$ of transistor 5 according to voltage $V_F$ at node F, referenced with respect to terminal 15. Voltage $V_F$ then expresses the gate-source voltage of transistor 5. It depends on the residual charge across capacitances C1 and C2 in parallel, and thus essentially on the residual charge in capacitance C2. The evaluation of drain current $I_{14}$ may be performed by maintaining terminals 12 and 15 at the same voltage (for example, the ground) and by applying a known voltage on terminal 14. Different reference voltages may also be applied on terminals 12 and 15, as will be seen hereafter in relation with FIGS. 13 and 14.

Figure 4:
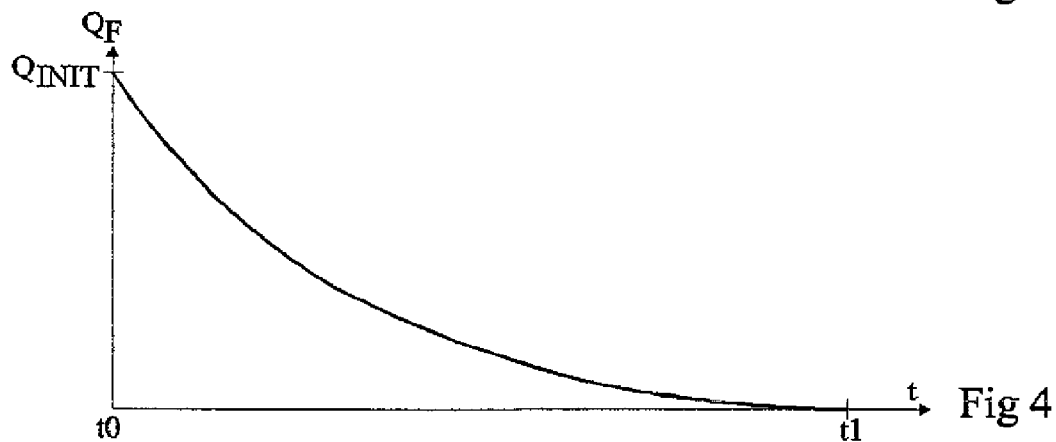
FIG. 4 is a graph illustrating the operation of the circuit of FIG. 2.

FIG. 4 illustrates the variation of charge $Q_F$ at node F along time. At a time t0 when voltage Valim stops being applied on terminal 13, charge $Q_F$ starts from an initial value $Q_{INIT}$, to annul at a time t1 with a capacitive discharge shape. The time interval between times t0 and t1 not only depends on the leakage capacity of the dielectric of element C1, but also on the value (and thus on the storage capacity) of element C2, which conditions value $Q_{INIT}$.

Assuming that terminals 12, 15 and second electrode 22 of capacitive element C1 are at reference voltages and that terminal 14 is biased to a determined level so that a variation in current $I_{14}$ only results from a variation in the voltage of node F, this variation then only depends on the time elapsed from time t0.

Such a result can be obtained due to the dissociation performed between the time leakage element (C1) and the element representative of the residual charge (C2).

The programming or resetting of the circuit through capacitive element C3 protects capacitive element C1 which has a relatively thin oxide thickness (dielectric) and which would otherwise risk being deteriorated in the programming. This especially enables making the measurements reliable and reproducible along time.

Several capacitive elements C3 may be connected in parallel between terminal 13 and node F to accelerate the programming or reset time.

Similarly, the retention time may be adapted not only by setting the thicknesses and/or the permittivities of the dielectrics of elements C1 and C2, but also by providing several elements C1 and/or C2 in parallel.

Figure 5:
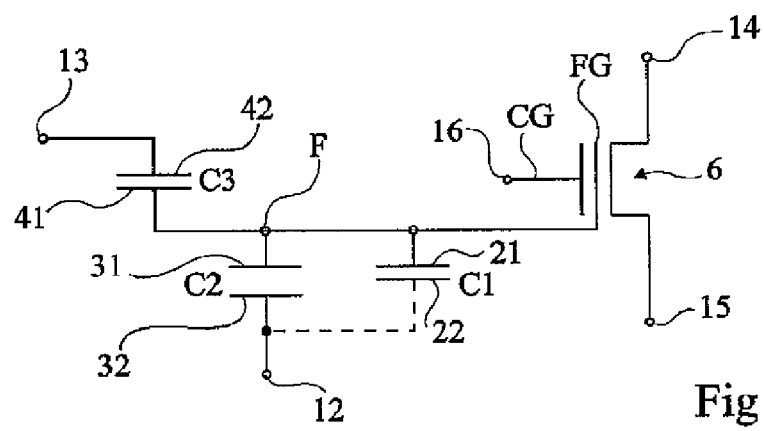
FIG. 5 shows a second embodiment of a charge retention circuit according to the first aspect of the present invention.

FIG. 5 shows a second embodiment of a circuit according to the present invention. As compared with the embodiment of FIG. 2, transistor 5 is replaced with a transistor 6 with a floating gate FG connected to node F. Control gate CG of transistor 6 is connected to a terminal 16 of control in read mode of the residual charge in the circuit.

Figure 6:
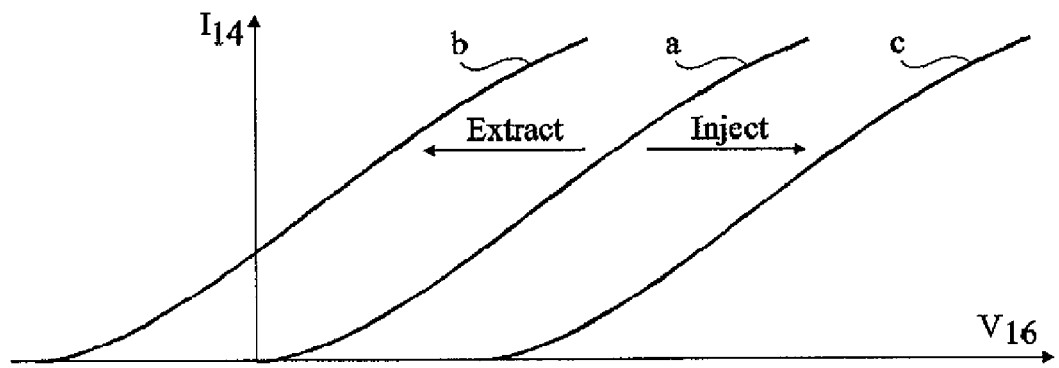
FIG. 6 is a current-vs.-voltage graph illustrating the operation of the circuit of FIG. 5.

FIG. 6 illustrates, in a graph of current $I_{14}$ versus voltage $V_{16}$ applied on the control gate, the operation of the circuit of FIG. 5. It is assumed that the voltage at drain and source terminals 14 and 15 of transistor 6 is maintained constant by an external read circuit (11, FIG. 1). The voltage drop between the floating gate and terminal 15 then depends on the electric charge present at node F, on the total capacitance between nodes F and 12 (essentially capacitances C1 and C2), and on the voltage applied on control terminal 16 of transistor 6. In FIG. 6, three curves a, b, and c have been illustrated. Curve a shows the case where node F is totally discharged. Curve b shows the case of a positive charge present on node F (electron extraction). The threshold of transistor 6 is then lowered. Curve c shows the case of a negative charge at node F (electron injection), which generates a higher threshold for the MOS transistor.

According to the applications, charges may be injected into or extracted from node F to modify the characteristic of transistor 6 from curve a to one of curves b and c. Once isolated from the programming voltage, the leakage of capacitance C1 provides curve a along time.

The dielectric thickness, between floating gate FG and the channel (active area) of transistor 6, is greater than that of element C1 and preferentially greater than that of element C3.

Figure 7:
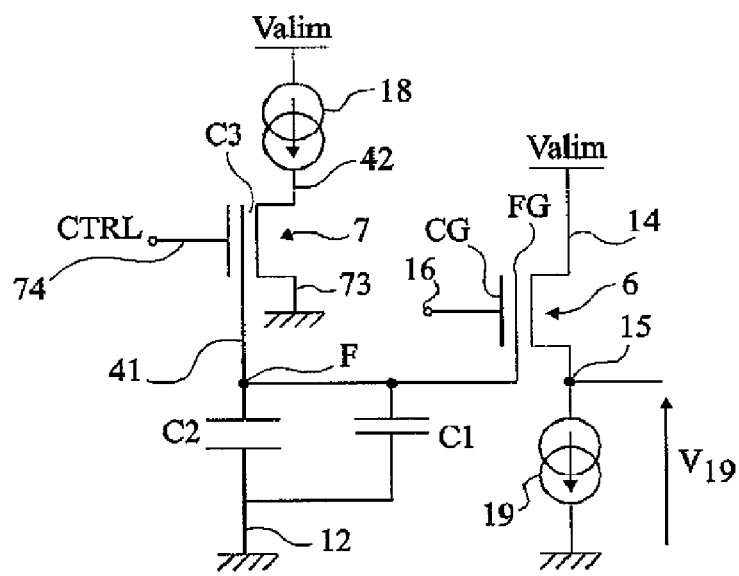
FIG. 7 shows a variation of the circuit of FIG. 5 in an example of environment.

FIG. 7 shows the electric diagram of a variation according to which charge injection or extraction element C3 is a MOS transistor 7 with a floating gate. In the example of FIG. 7, the circuit has been shown as connected in a portion of its environment. For example, drain 42 of transistor 7 is connected to a current source 18 receiving voltage Valim and its source 73 is grounded. Its control gate 74 receives a control signal CTRL intended to turn on transistor 7 when charges need to be injected. Floating gate 41 of transistor 7 is connected to node F. The drain (terminal 14) of transistor 6 receives supply voltage Valim and its source is grounded by a current source 19. Voltage $V_{19}$ across current source 19 is representative of the voltage at node F.

The variation of FIG. 7 provides a structure enabling injection of electrons on node F by a so-called hot carrier (electrons) phenomenon, by applying adapted voltages between terminals 42, 73, and 74.

After, an electron extraction (application on terminal 13 of a positive reset voltage with respect to terminal 12) by Fowler-Nordheim effect is assumed, but the operation which will be described easily transposes to an injection of electrons at node F, for example, by a so-called hot carrier phenomenon.

There appears from the foregoing description that it is possible to define a correlation between the residual charge (with respect to the initial charge) and the time spent after a circuit reset phase.

Any circuit for reading the voltage of node F may be envisaged. For example, the measured value of the current in transistor 5 (or 6) or of a voltage representative of this current may be converted into time based on a conversion table or, after digitization, on a conversion law established from a characterization of the circuit. A preferred example of a read circuit for interpreting the time discharge will be described in relation with FIG. 13 to 19B.

Although reference has been made to a single supply voltage Valim, different voltages may be used in programming and reading, provided to have an exploitable reference between the residual charge and the measurement.

According to a specific example of embodiment, a charge retention circuit according to the first aspect of the present invention is formed with the following values:
- capacitance C1: 2 fF, dielectric thickness: 40 angstroms;
- capacitance C2: 20 fF, dielectric thickness: 160 angstroms;
- capacitance C3: 1 fF, dielectric thickness: 80 angstroms.

Such a circuit initialized by application of a voltage on the order of 12 volts is discharged after approximately one week. This of course is an example only, the values of the dielectric thicknesses, the dielectric constants, and the possible parallel association of several elements C1 or C2 conditioning the charge retention time.

FIGS. 8A, 8B, 8C, 9A, 9B, 9C, 1A, 10B, 10C, 11A, 11B, 11C, 12A, 12B, and 12C show the forming of a circuit according to the embodiment of FIG. 7 in an integrated structure derived from an EEPROM memory architecture, according to the second aspect of the present invention.

Figure 8A:
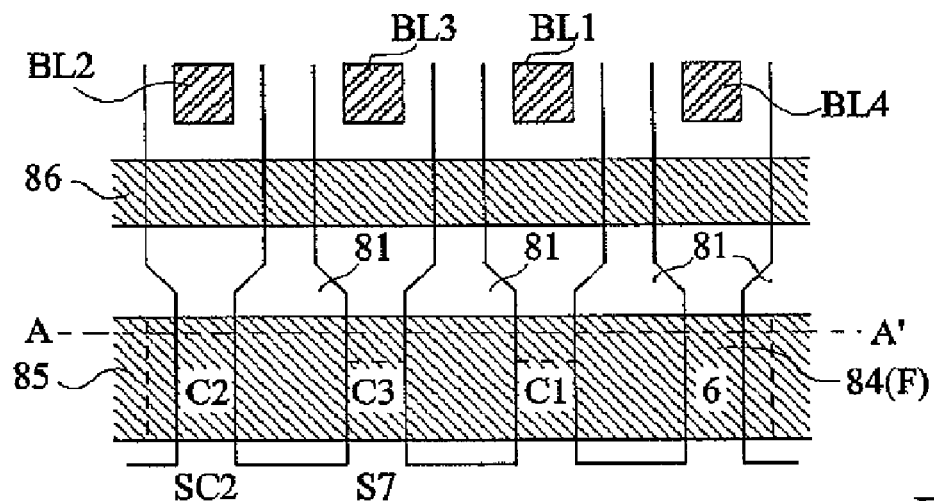
FIGS. 8A, 8B, and 8C respectively are a top view, a cross-section view along a first direction and the equivalent electric diagram of an embodiment of an electronic charge retention circuit according to the second aspect of the present invention.
Figure 8B:
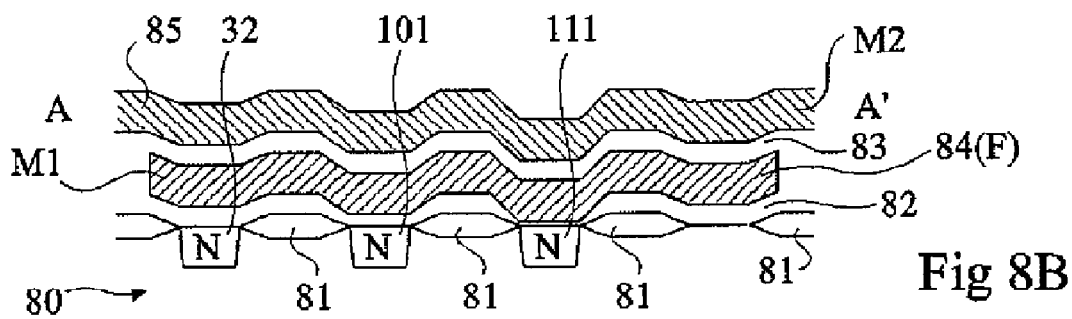
Figure 8C:
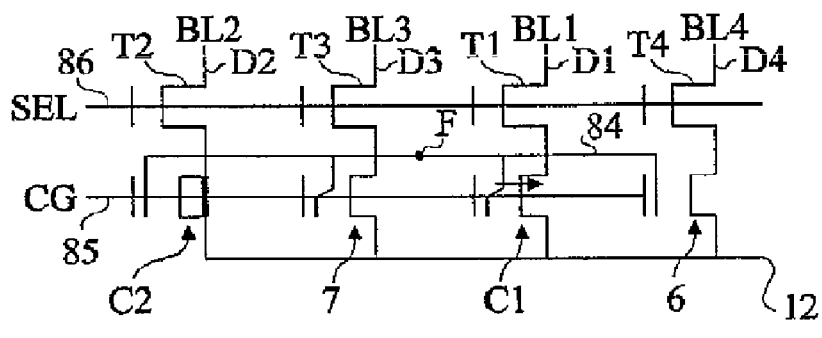

FIGS. 8A, 9A, 10A, 11A, and 12A are simplified top views, respectively of the electronic charge retention circuit and of its elements C2, 7, C1, and 6. FIG. 8B is a cross-section view along line AA' of FIG. 8A. FIGS. 9B, 10B, 11B, and 12B respectively are cross-section views along lines BB' of FIGS. 9A, 10A, 11A, and 12A. FIGS. 8C, 9C, 10C, 11C, and 12C show the respective equivalent electric diagrams of the electronic charge retention circuit and of its elements C2, 7, C1, and 6.

In the described example, an N-channel transistor implementation in a P-type silicon substrate is assumed. The opposite is of course possible.

Each element or cell C2, 7, C1, or 6 is obtained from a floating gate transistor series-connected with a single-gate selection transistor T2, T3, T1, or T4 for selecting, for example from an EEPROM memory cell array, the electronic charge retention circuit.

The floating gates of the different transistors forming elements C2, 7, C1, and 6 are interconnected (conductive line 84) to form floating node F. Their control gates are connected together to a conductive line 85 of application of read control signal CG. Their respective sources are interconnected to terminal 12 (the ground) and their respective drains are connected to the respective sources of selection transistors T2, T3, T1, and T4.

The gates of transistors T1 to T4 are connected together to a conductive line 86 of application of a circuit selection signal SEL. Their respective drains D1 to D4 are connected to individually-controllable bit lines BL1 to BL4. The order of the bit lines in FIG. 8C has been arbitrarily illustrated as BL2, BL3, BL1, and BL4, but the order of the different elements C2, 7, C1, and 6 in the horizontal row direction (in the orientation of the drawings) is indifferent.

In this example of embodiment, N-type source and drain regions (FIG. 8B), separated from one another in the line direction by insulating areas 81, are assumed. The floating gates are formed in a first conductive level M1 separated from the active regions by an insulating level 82 and the control gates are formed in a second conductive level M2 separated from the first one by a third insulating level 83. The gates of the selection transistors are formed, for example, in level M1.

A difference with respect to a conventional EPROM memory cell array is that the floating gates are interconnected by groups of four transistors to form floating node F. Another difference is that the floating-gate transistors forming the different circuit elements are different from one another across the thickness of their tunnel window and/or in their drain and source connection.

Figure 9A:
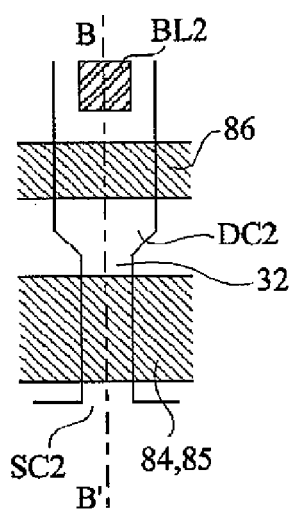
FIGS. 9A, 9B, and 9C respectively are a top view, a cross-section view along a second direction, and the equivalent electric diagram of a first element of the circuit of FIGS. 8A to 8C.
Figure 9B:
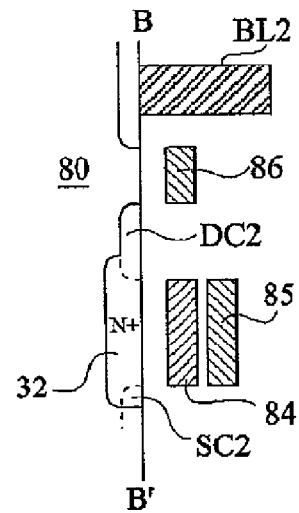
Figure 9C:
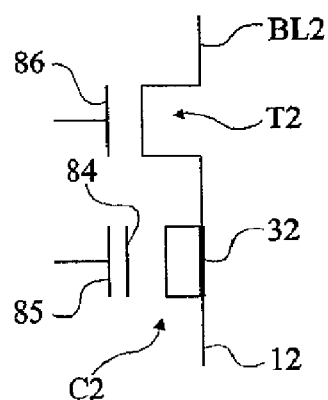

FIGS. 9A to 9C illustrate the forming of storage capacitor C2. Drain DC2 and source SC2 of the corresponding floating-gate transistor are short-circuited (by extension of the $N^+$-type implantation across the entire active area, FIG. 9B) to form electrode 32 of the capacitor. Further, the tunnel window is eliminated with respect to a standard EEPROM cell.

Figure 10A:
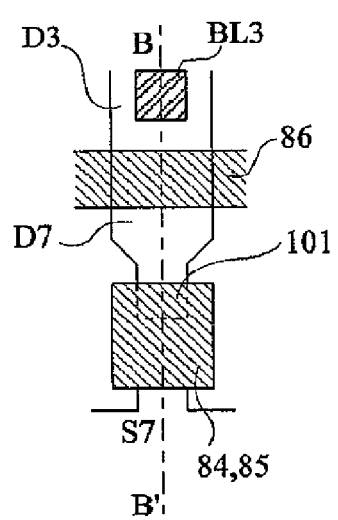
FIGS. 10A, 10B, and 10C respectively are a top view, a cross-section view along the second direction and the equivalent electric diagram of a second element of the circuit of FIGS. 8A to 8C.
Figure 10B:
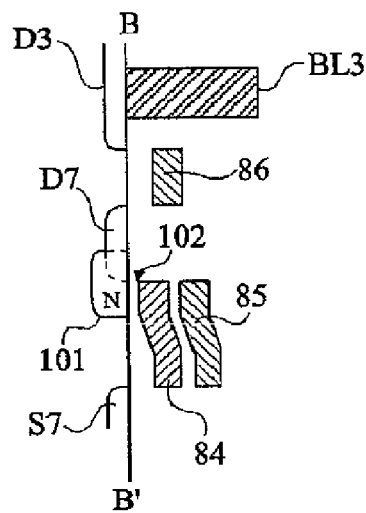
Figure 10C:
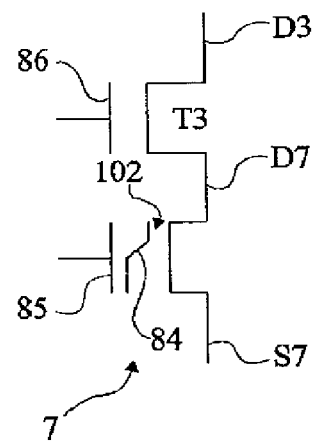

FIGS. 10A to 10C illustrate the forming of transistor 7 forming capacitive programming element C3. It is a standard EEPROM cell having the extension 101 of its N doped area under tunnel window 102 (FIG. 10B) providing a platform in the charge injection area. As a standard EEPROM cell, drain area D7 is connected to the source of selection transistor T3. Source area S7 is connected to terminal 12.

FIGS. 11A, 11B, and 11C illustrate the forming of capacitive element C1 forming the leakage element of the charge retention circuit. As compared with a standard EEPROM cell, a difference comprises thinning (area 112, FIG. 11B) the dielectric window used for the tunnel effect to increase leakages. For example, the thickness of dielectric 112 is selected to be approximately half (for example, between 30 and 40 angstroms) that (for example, between 70 and 80 angstroms) of a tunnel window (102, FIG. 10B) of an unmodified cell.

FIGS. 12A, 12B, 12C illustrate the forming of read transistor 6, in which the tunnel window has been eliminated as well as, preferably, the usual implanted area (101, FIG. 10B) of an EEPROM cell. The active area limited by source S6 and D6 is thus similar to that of a normal MOS transistor.

The representations of FIGS. 8A to 12C are simplified and may be adapted to the used technology. In particular, the gates has been shown as aligned with the limits of the drain and source areas, but a slight overlapping is often present.

An advantage of the forming by means of an EEPROM cell technology is that the charge retention circuit may be programmed and reset by applying the same voltage levels and the same time windows as those used to erase or write into EEPROM memory cells.

Another advantage is that this preserves stability along time while avoiding degradations of the thin oxide of the leakage element (C1) in successive write operations.

The respective connections of bit lines BL1 to BL4 depend on the circuit operating phases and especially on the programming (reset) or read phase.

Table I hereinafter illustrates an embodiment of a reset (SET) of and a reading (READ) from an electronic charge retention circuit such as illustrated in FIGS. 8A to 12C.

TABLE I

|  | SEL | CG | BL2 | BL3 | BL1 | BL4 | 12 |
| --- | --- | --- | --- | --- | --- | --- | --- |
| SET | $VPP_1$ | 0 | HZ | $VPP_2$ | HZ | HZ | HZ |
| READ | $V_{SEL}$ | $V_{READ}$ | HZ | HZ | HZ | $V_{14}$ | 0 |

In a reset phase SET, selection signal SEL is brought to a first high voltage $VPP_1$ with respect to ground to turn on the different transistors T1 to T4 while signal CG applied on the control gates of the floating gate transistors remains at low level 0 so as to turn on transistor 6. Bit lines BL1, BL2, and BL4 remain floating (high-impedance state HZ) while line BL3 is applied a positive voltage $V_{PP2}$ enabling charge of floating node F. Line 12, common to the sources of the floating-gate transistors, is preferentially left unconnected HZ.

For the reading READ, the different selection transistors are activated by signal SEL to a level $V_{SEL}$ and a read voltage $V_{READ}$ is applied to the control gates of the different floating gate transistors. Lines BL1, BL2, and BL3 are in a high-impedance state HZ while line BL4 receives a voltage $V_{14}$ enabling supply of the read current source. Line 12 is here grounded.

The relations between the different levels $VPP_1$, $VPP_2$, $V_{SEL}$, $V_{READ}$, and $V_{14}$ are, preferably, the following:

$VPP_1$ greater than $VPP_2$;

$V_{SEL}$ greater than $V_{READ}$;

$V_{READ}$ of the same order of magnitude as $V_{14}$.

According to a specific example of embodiment:

$VPP_1$=14 volts;

$VPP_2$=12 volts;

$V_{SEL}$=4 volts;

$V_{READ}$=2 volts; and $V_{14}$=1 volt.

What has been described hereabove in relation with one EEPROM cell per element of the charge retention circuit may of course be replaced with a structure in which subsets of several identical cells in parallel are used for the different respective elements. In particular:

several elements C2 may be used in parallel to increase the capacitance of node F to increase the electronic circuit discharge time;

several elements 7 may be used in parallel to increase the electron injection or extraction speed at node F on reset of programming;

several leakage elements C1 may be used in parallel to decrease the system discharge time; and/or several read elements 6 may be introduced in parallel to provide a greater current on evaluation of the circuit.

An electronic retention circuit may be introduced in any position of a standard EEPROM memory cell array, which enables making more difficult its locating by a possible ill-meaning user.

As a variation, several circuits may be placed at different locations of an EEPROM memory plane. In this case, it may be provided for all the circuits to have the same discharge time or for the circuits to have discharge times different from one another.

According to another variation, although several circuits are distributed in the memory plane, a single one is used at once, according to a determined or random sequence controlled by an address generator.

The cell selection transistors forming the charge retention circuit of the present invention may be shared with normal EEPROM cells on the same bit lines, provided to provide adapted addressing and switching means.

Figure 13:
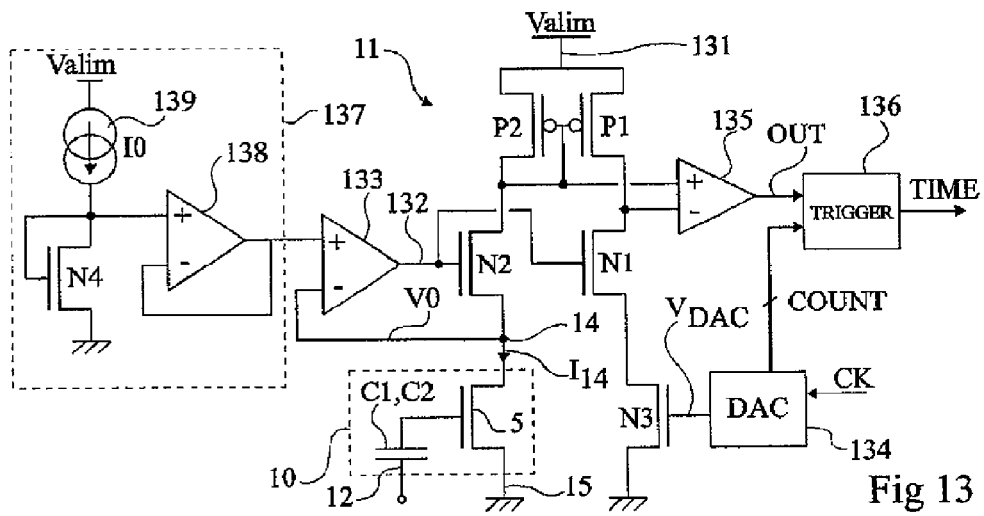
FIG. 13 shows a first embodiment of a read circuit of an electronic charge retention circuit according to the third aspect of the present invention.

FIG. 13 shows a first embodiment of a circuit (11, FIG. 1) for reading the state of an electronic charge retention circuit for a time measurement according to the third aspect of the present invention. For simplification, the charge retention circuit (FIG. 2, FIG. 5, FIG. 7, or FIGS. 8A to 12C) has been symbolized by a block 10 containing the read transistor (in this example, a MOS transistor 5) and a capacitive element combining elements C1 and C2.

More generally, according to this third aspect of the present invention, the charge retention circuit may be formed of any circuit (for example, that described in above-mentioned international patent application WO-A-03/083769).

Output transistor 5 of circuit 10 is placed in a first branch of a differential assembly comprising two parallel branches of MOS transistors in series between a terminal 131 of application of a supply voltage Valim and the ground. Each branch comprises, in series, a P-channel transistor P1 or P2, an N-channel transistor N1 or N2, and an N-channel transistor N3 or N5. The two transistors P1 and P2 have their gates connected to the source of transistor P2 and their drains connected to supply terminal 131. Transistors N1 and N2 have their gates connected to a terminal 132 of application of a reference voltage. This reference voltage is provided, in this example, by an operational amplifier 133 receiving on a non-inverting input (+) a voltage V0 and having its inverting input (−) connected to the source of transistor N2 and to the drain of transistor N5 (terminal 14 of circuit 10). Optional assembly 133, N1 and N2 enables setting a same voltage level on the sources of transistors N1 and N2. The gate of transistor N3 receives an analog signal $V_{DAC}$ provided by a digital-to-analog converter 134, the operation of which will be described hereafter. Its function is to provide a stepped voltage to interpret the residual charge in circuit 10.

The respective sources of transistors P2 and P1 are connected on two inputs, for example, non-inverting (+) and inverting (−), of a comparator 135 with an output OUT which is used to trigger (TRIGGER 136) the provision of a result TIME corresponding to a binary word representative of the state COUNT of a counter of the converter. This counter counts at the rate of a clock frequency CK to generate the stepped signal, as will be seen hereafter.

The circuit of FIG. 13 performs a comparison of the difference between the currents in the two branches. The output of comparator 135 switches when the current in branch P1, N1, and N3 becomes greater (or lower according to the initial state) than the current in branch P2, N2, and N5.

If terminal 12 is grounded, for a current $I_{14}$ to flow in the first branch, quantity $Q_F/C_T$ should be greater than the threshold voltage ($V_t$) of transistor 5, where $Q_F$ represents the residual charge in circuit 10 and $C_T$ represents the cumulated value of the capacitances between node F and the ground (in particular, capacitive elements C1 and C2).

Voltage V0 imposed on terminal 14 via amplifier 133 preferably originates from a circuit 137 comprising a follower-assembled amplifier 138 (output connected to the inverting input (−)) having its non-inverting input (+) connected to the drain of a diode-assembled N-channel transistor N4. The source of transistor N4 is grounded while its drain is connected, by a constant current source 139 (I0), to a terminal of application of a positive supply voltage (for example, Valim).

Circuit 137 generates a level V0 such that transistor 5 is conductive to enable the reading.

Current I0 is selected according to the consumption wanted for the circuit.

The N-channel transistors are matched for accuracy reasons.

Preferably, a level greater than level V0 is imposed on terminal 12. An objective is, even if cell 10 is entirely discharged, to have transistor 5 conduct and enable reading across the entire operating range. Thus, the output of comparator 135 switches when voltage $V_{DAC}$ provided by converter 134 exceeds level $V0+Q_F/C_T$.

Figure 14:
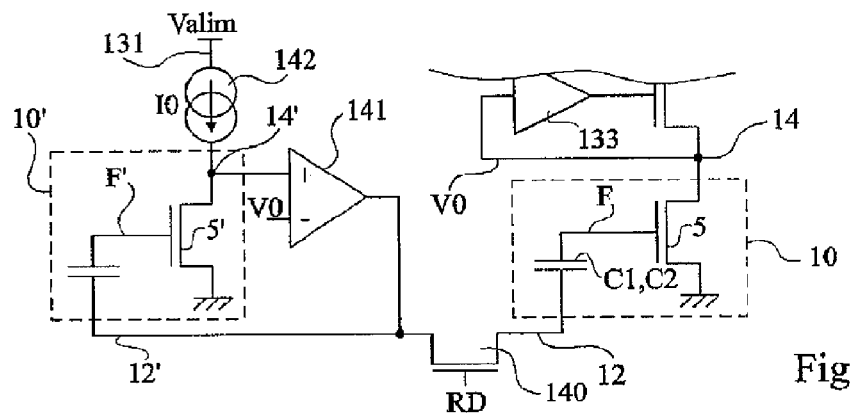
FIG. 14 partially shows a second embodiment of a read circuit of an electronic charge retention circuit according to the third aspect of the present invention.

FIG. 14 shows a preferred embodiment in which a reference structure 10' having its node F' permanently discharged is used to set the voltage of terminal 12 of circuit 10. For example, a transistor 140 (Pass Gate) connects terminals 12 and 12' of circuits 10 and 10'. An amplifier 141 has its non-inverting input (+) connected to terminal 14' of circuit 10' and, by a constant current source 142 (I0), to terminal 131 of application of the supply voltage. The inverting input (−) of amplifier 141 receives reference voltage V0 generated by a circuit 137 such as described in relation with FIG. 13. Current sources 139 and 142 generate a same current I0. Accordingly, the voltage of terminal 14' is set to V0 (imposed by the feedback of amplifier 141 and by the gate of transistor 5', which is at level V0, by the sizing of source 142). The voltage of terminal 12' is greater than level V0 even if no charge is stored at node F'. Indeed, when a voltage is applied on terminal 12' (by amplifier 141), node F' represents the midpoint of a capacitive divider (be it only by taking into account the gate capacitance of transistor 5' with respect to ground). Accordingly, to obtain level V0 at node F', the voltage of terminal 12' is greater than level V0.

To simplify the description of FIG. 14, the rest of the structure, identical to that discussed in relation with FIG. 13, has not been detailed.

Transistor 140 is only turned on in read mode of the circuit. The rest of the time, terminal 12 is either unconnected, or grounded.

When transistor 140 is on, the voltage of terminal 12' is transferred to terminal 12. Since the voltage of terminal 14 is set to level V0 by amplifier 133 (having its non-inverting input connected to the output of circuit 137), the voltage of node F is at level V0 plus the charge stored on this node. If cell 10 is not charged, node F is at level V0. If the cell contains a charge $Q_F$, the voltage at node F is equal to $V0+Q_F/C_T$.

An advantage of this embodiment where transistor 140 sets the same voltage on the second accessible electrodes of the capacitive elements of circuits 10 and 10' is to compensate for possible manufacturing dispersions.

Be it the read circuit of FIG. 13 or of FIG. 14, it can be turned off by means of adapted control switches (for example, disconnecting the power supply branches and/or turning off the current sources) outside of read periods.

On the read side, assuming that charge $Q_F$ has an initial value $Q_{INIT}$, here noted Q(r), a stepped voltage $V_{DAC}$ provided by converter 134 ranging between V0 and $V0+Q(r)/C_T$ enables measuring time.

Starting from a level $V0+Q(r)/C_T$ and progressively decreasing the level, the switching point of comparator 135 corresponds to a digital reference point COUNT of the converter. This reference point is an information as to the time elapsed since the reset (programming of charge retention circuit 10) at level Q(r). Examples will be given in relation with FIGS. 16A to 19B.

An advantage is that the outputting of a digital word is easily exploitable.

Preferably, the digital-to-analog converter is a non-linear converter to compensate for the non-linear curve (FIG. 4) followed by the capacitive discharge of the charge retention circuit. As a variation, the correction is performed downstream by digital means (of calculator type) correcting the elapsed time according to count COUNT at which the read circuit switches.

Figure 15:
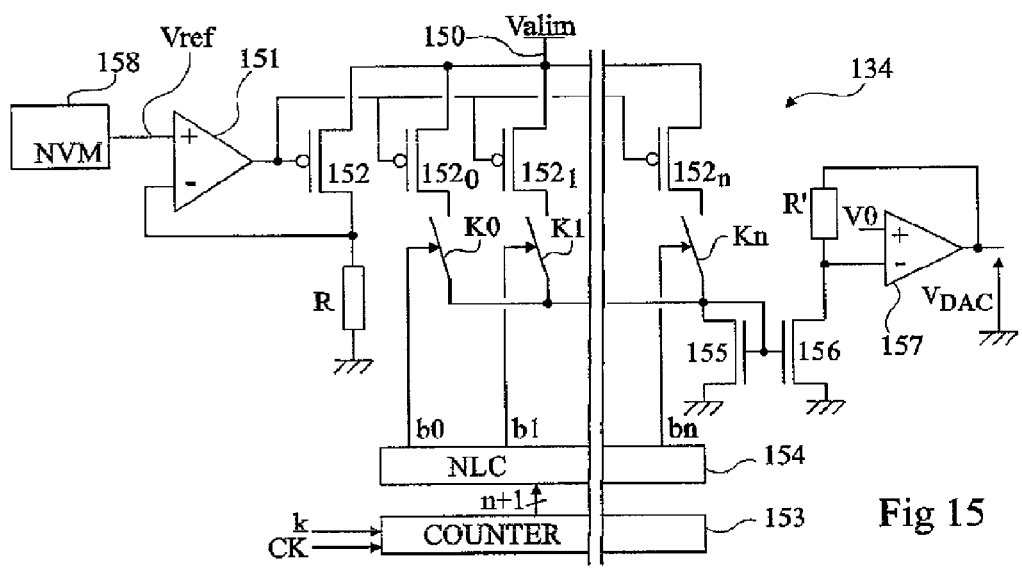
FIG. 15 shows an example of a non-linear digital-to-analog converter usable in a read circuit according to the third aspect of the present invention.

FIG. 15 shows an example of an electric diagram of a digital-to-analog converter 134. A reference voltage $V_{ref}$ is provided on a differential amplifier 151 having its output connected to the common gates of n+2 branches comprising a P-channel MOS transistor 152, $152_0$, $152_1$, ..., $152_n$. A first transistor 152 has its source grounded by a resistor R and connected to the inverting input (−) of amplifier 151 to set a $V_{ref}/R$ current. Transistors $152_0$ to $152_n$ of the next n+1 branches $152_0$ to $152_n$ are of increasing size from one branch to the next one, starting from the unity size of transistor $152_0$, equal to that of transistor 152. The size ratio is preferably double from one branch to the next one to reflect the binary character of the counting on the voltage amplitudes. The respective sources of transistors 152 and $152_0$ to $152_n$ are connected to a terminal 150 of application of a supply voltage Valim. The respective drains of transistors $152_0$ to $152_n$ are connected, by switches $K_0$ to $K_n$, to the drain of a N-channel MOS transistor 155 assembled as a diode and as a current mirror on a second N-channel transistor 156. The sources of transistors 155 and 156 are grounded. The drain of transistor 156 is connected to an inverting input (−) of an operational amplifier 157 having its non-inverting input (+) receiving reference voltage V0 of the read circuit and having its output providing voltage $V_{DAC}$. A resistor R' (for example, of same value as resistor R) connects the output of amplifier 157 to its inverting input. Switches $K_0$ to $K_n$ (for example, MOS transistors) are controlled by respective bits b0, b1, ..., bn of a counting circuit over n+1 bits. The counting circuit comprises a counter 153 having n+1 bits sent in parallel onto a non-linear conversion circuit 154 (NLC). Amplifiers 151 and 157, as well as counter 153 and circuit 154, are supplied, for example, with voltage Valim.

Assuming resistors R and R' to be of the same value, the current in transistor 156 is equal to $k*V_{ref}/R$, where k represents state COUNT of the counting circuit. Output voltage $V_{DAC}$ is then provided by relation $V0+k*V_{ref}$.

Other non-linear digital-to-analog conversion circuits may be used, the circuit of FIG. 15 representing a simple example of embodiment of such a converter.

Figures 16A, 16B:
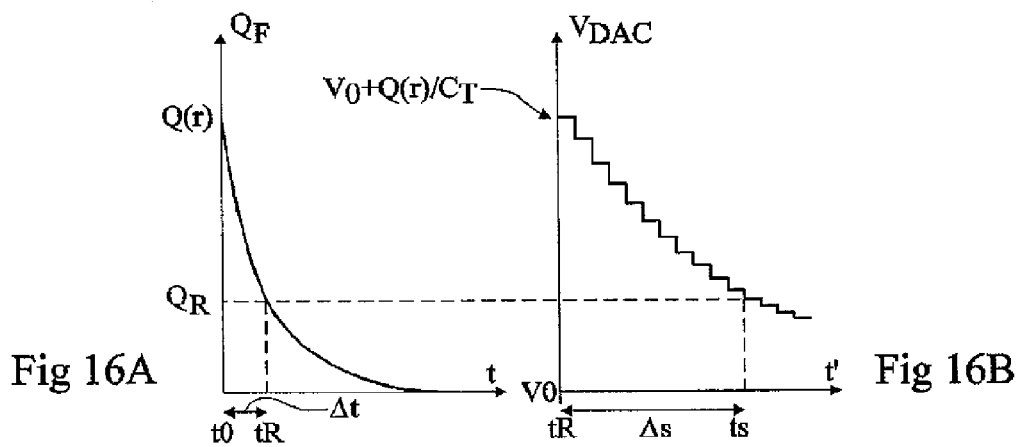
FIGS. 16A and 16B are graphs illustrating an operating mode of a read circuit according to the third aspect of the present invention.

FIGS. 16A and 16B illustrate a first operating mode of a read circuit according to the third aspect of the present invention and respectively show examples of variations of voltage $Q_F$ and of voltage $V_{DAC}$ along time.

An initialization of the discharge circuit at a level Q(r) at a time t0 and a reading at a time $t_R$ where the residual charge is $Q_R$ are assumed.

The non-linearity of the converter is defined by circuit 154 to compensate for the charge retention circuit discharge curve, for example, based on experimental or characterization data. Circuit 154 is, for example, a combinational logic converting a linear increase of the output of counter 153 into a non-linear increase.

According to the time at which the reading is performed (for example, $t_R$, FIG. 16A), the current in transistor 5 generates a switching of output OUT with a delay Δs with respect to the read beginning time (time origin of the timing diagram of FIG. 16B). This time interval actually corresponds to a number provided by counter 153 in the generation of the stepped voltage sent onto the gate of transistor N3 (FIG. 13). The state of the counter at the time when signal OUT switches enables deducing the time interval Δt elapsed between programming time t0 and read time $t_R$, whether the device containing the charge retention circuit has or not been supplied (provided for its terminal 13 to have remained unconnected or isolated). In the example of FIGS. 16A and 16B, a voltage $V_{DAC}$ decreasing from level $V0+Q(r)/C_T$ is assumed. A measurement by increasing voltage is of course possible, switching point $t_S$ remaining the same.

The rate of the steps of voltage $V_{DAC}$ (and thus frequency CK of counter 153) is selected to be sufficiently fast with respect to the discharge speed of circuit 10 for interval Δs between the read beginning time $t_R$ and switching time $t_S$ to be negligible with respect to real interval Δt ($t_R-t_0$). The exaggeration of the representation of the drawings however shows the opposite.

It can thus be seen that the discharge of element 10 of the present invention may be performed with no power supply, without for all this to loose the time notion.

Voltage $V_{ref}$ is preferably selected to comply with equation $k*V_{ref}=Q(r)/C_T$.

Preferably, an adjustment of the read circuit is performed by storing, in a non-volatile memorization register 158 (NVM), a voltage value $V_{ref}$ or starting number k of the counter obtained by characterization to comply with the above relation, and by using this value on each reading.

Figures 17A, 17B:
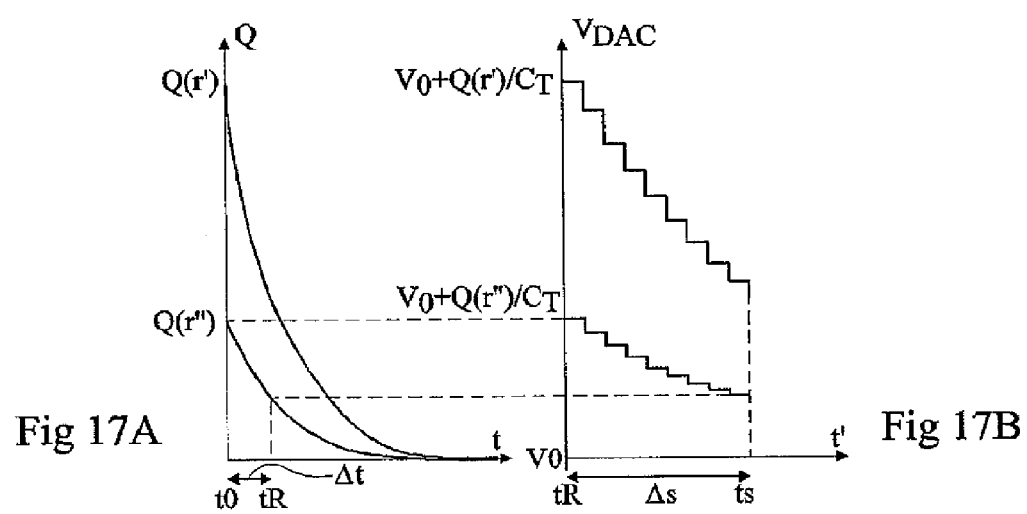
FIGS. 17A and 17B are graphs illustrating a variation of the third aspect of the present invention.

FIGS. 17A and 17B show, in two initial charge states Q(r') and Q(r"), examples of decrease in the charge along time and the possible adjustment performed with the non-linear digital-to-analog converter.

The fact of adjusting the reference value (in this example, respectively at values $Q(r')/(k^*C_T)$ and $Q(r'')/(k^*C_T)$) makes the time measurement independent from the programming conditions, that is, from initial charge Q(r') or Q(r"). As can be seen in FIGS. 17A and 17B, switching time $t_S$ is the same while the converter starting levels are different, as they are adapted to the initial charge levels.

According to whether the discharge curve is known or not, it may be necessary to calibrate each discharge circuit 10 so that the non-linearity of converter 134 follows the discharge curve.

FIGS. 18A, 18B, 19A, and 19B illustrate a preferred embodiment of the present invention in which a calibration of the read circuit is performed in a first use, in an initialization, or at the end of the manufacturing. For this purpose, the circuit is programmed at a time t10, then measured at a time t11, its interval with respect to time t10 being known (for example, a 24-hour interval). The number of steps of the stepped decrease provided by the digital-to-analog converter until switching time $t_S$ is then determined. This enables defining, for the concerned circuit, the number of steps or stages for the known time interval. This number can then be stored in a non-volatile storage element of device 1.

Figures 18A, 18B:
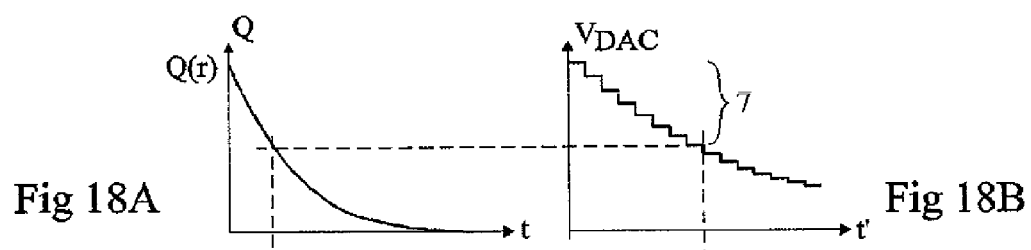
FIGS. 18A and 18B are graphs illustrating an embodiment of a method for characterizing a read circuit according to the third aspect of the present invention for a first example of charge retention circuit.

FIGS. 18A and 18B illustrate a first example in which 7 steps are required for 24 h. The time interval (TIME STEP) between two steps is then 24/7.

Figures 19A, 19B:
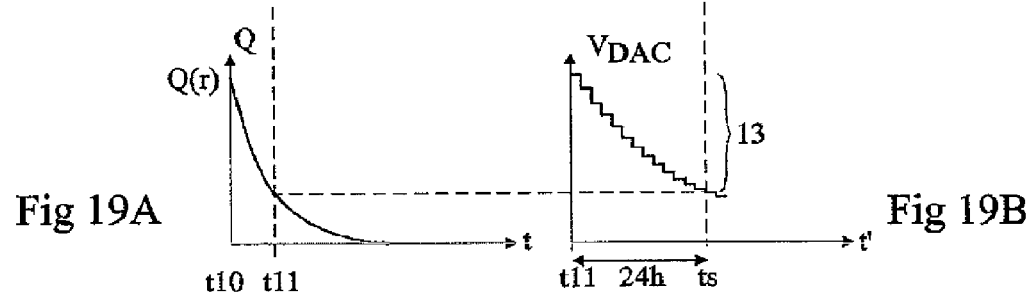
FIGS. 19A and 19B are graphs illustrating the embodiment of the read circuit characterization method for a second example of charge retention circuit.

FIGS. 19A and 19B illustrate a second example in which 13 steps are required to define a same time range by means of another different circuit, for example, by the values of capacitances C1 and C2. The time interval between two steps is then 24/13.

Figure 20:
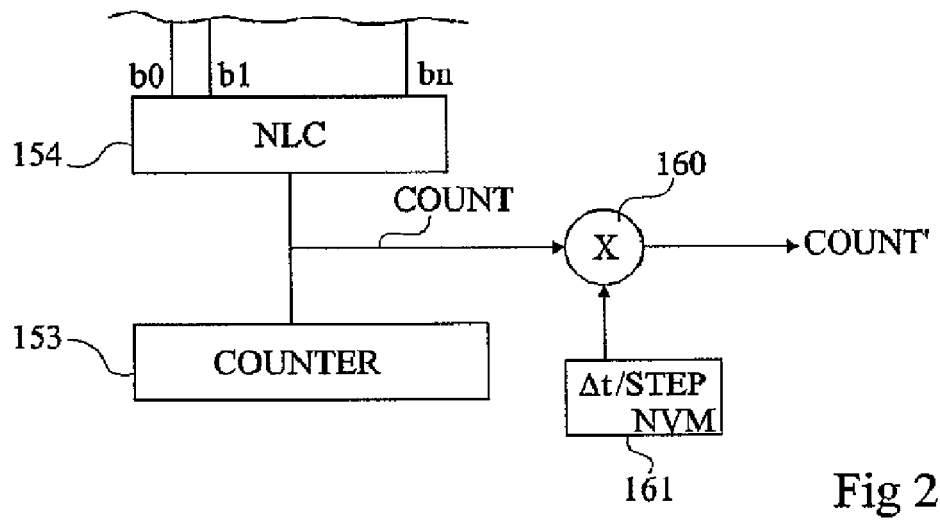
FIG. 20 partially and schematically shows a variation of the read circuit compatible with the characterization method of FIGS. 18A, 18B, 19A, and 19B.

FIG. 20 is a schematic block diagram partially illustrating an example of possible adaptation of the circuit of FIG. 15 to obtain the operation of FIGS. 18A, 18B, 19A, and 19B. This modification comprises using count COUNT provided by counter 153 to multiply it (multiplier 160) by a time conversion parameter (Δt/STEP) stored in the non-volatile memory (block 161, NVM), to provide a modified counting value COUNT' taking into account the circuit characteristics. Value COUNT' is provided to trigger 136. This amounts to applying a weighting coefficient which is a function of an initial circuit characterization measurement.

An advantage of this embodiment is that it requires no structural modification of the read circuit to adapt to different charge retention circuits.

Figure 21:
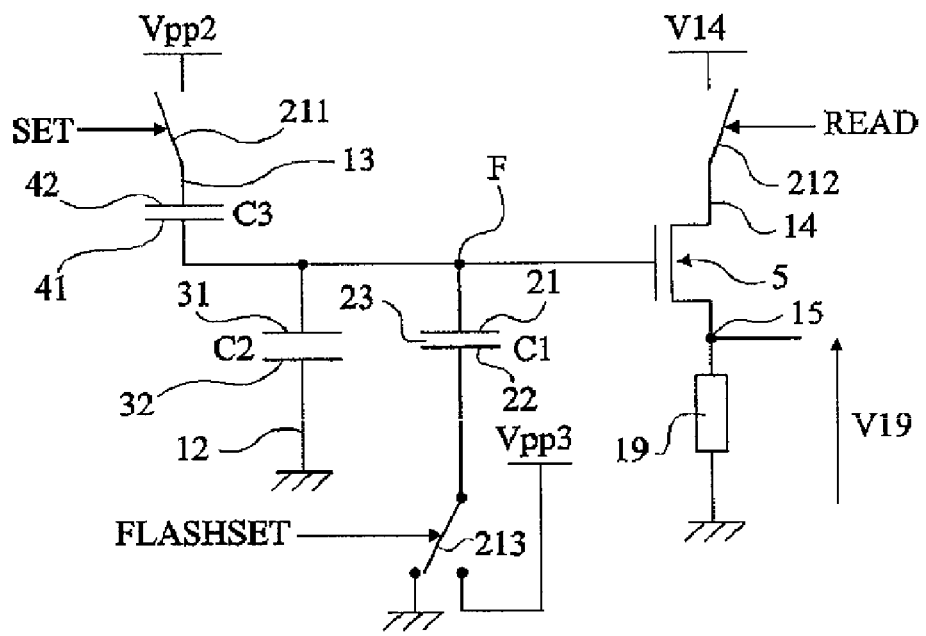
FIG. 21 shows an embodiment of a charge retention circuit according to an embodiment of the present invention.

FIG. 21 is a schematic block diagram illustrating an embodiment of a charge retention circuit in an example of environment implementing the fourth aspect of the present invention.

This drawing is based as an example on the embodiment of the charge retention circuit shown in FIG. 2. Terminal 13 is connectable by a switch 211 controlled by programming signal SET to a voltage $VPP_2$ for initializing a discharge period. Terminal 14 is connectable, by a switch 212 controlled by read signal READ, to a read voltage $V_{14}$, voltage $V_{19}$ across current source 19 (illustrated by a resistor) providing data representative of the time elapsed since the initialization.

According to a preferred example of the fourth aspect of the present invention, element C1 is also usable as a fast programming element by applying adapted voltage levels to obtain a fast injection or extraction of electrons on node F. A switch 213 then is interposed between electrode 22 of element C1 and a terminal of application of a voltage $VPP_3$ to force a charge injection or extraction on node F. Switch 213 is controlled by a fast programming signal FLASH SET. In the quiescent state (when it does not apply voltage $VPP_3$ on electrode 22), switch 213 at least functionally grounds electrode 22. In practice, switch 213 may leave terminal 22 unconnected. It is enough for a discharge path to exist, due to the circuit structure, from node F to the ground through leakage element C1. Such is in practice almost always the case.

The example described in relation with FIG. 21 is particularly well adapted to a charge retention circuit formed from floating-gate transistors (FIGS. 8A to 12C).

Such a fast programming (relatively fast as compared with the normal programming by element C3) may be used, for example, after a detection of an abnormal operating condition aiming at preventing the normal circuit programming.

The risk of stressing the dielectric of element C1 and thus losing the reproducibility of the measurements is acceptable since this case is in principle uncommon along the product lifetime. Further, any alteration of the dielectric tends to accelerating the discharge, and thus reduce the time window. Now, such is most often the desired effect in case of an abnormal operation. In particular, if such an operation is provided in case an attempt for hacking a product is detected, decreasing the capacity of use on each detection follows the line of generally desired protections.

According to the applications, the fast programming function may be used either to bring charges onto node F and restart a time period, or conversely to force a fast discharge of node F, for example, to forbid a subsequent access to data protected by the charge retention circuit.

Table II hereafter illustrates an embodiment of a fast programming (FLASH SET) according to the fourth aspect of the present invention in an embodiment of the charge retention circuit of the type illustrated by FIGS. 8A to 12C. Table II shows the programming and read phases of above-described table I.

TABLE II

|  | EL | CG | BL2 | BL3 | BL1 | BL4 | 12 |
|---|---|---|---|---|---|---|---|
| SET | $PP_1$ | 0 | HZ | $VPP_2$ | HZ | HZ | HZ |
| FLASH SET | $PP_1$ | 0 | HZ | HZ | $VPP_3$ | HZ | HZ |
| READ | SEL | $V_{READ}$ | HZ | HZ | HZ | $V_{14}$ | 0 |

Fast programming FLASH SET comprises applying bias voltage $VPP_3$ (for example, equal to the level $VPP_2$ which is available) on line BL1 (FIG. 8C), while all the other bit lines BL2 to BL4 are in high impedance state HZ, and a zero signal CG while signal SEL at level $VPP_1$ turns on selection transistors T1 to T4. Line 12 preferentially is in a high-impedance state HZ.

The fast programming takes advantage of the low dielectric thickness of element C1 with respect to dielectric 102 (FIG. 10B) of reset transistor 7 to accelerate the programming.

An advantage of this aspect of the present invention is to combine a time measurement after periods of no supply with a fast programming function in charge or discharge mode.

The present invention finds many applications in any system where a time is desired to be measured on a non-supplied circuit. A specific example of embodiment relates to the management of rights of access to data or programs stored on digital supports. In such an application, a circuit according to the present invention may be added to the storage system (memory key or the like) which is not permanently supplied, or be in a separate circuit and be reset, for example, on a first loading of the data to be protected.

A second example of application relates to the measurement of time intervals between any two elements, for example, in applications of transactional type.

Of course, the present invention is likely to have various alterations, modifications, and improvements which will readily occur to those skilled in the art. In particular, the practical implementation of the present invention based on the functional indications given hereabove and on the needs of the application raises no difficulty. For example, the programming may be accessible only once or be resumed at each powering-on of the application. Further, especially since it requires no permanent power supply, the present invention may be implemented in contactless devices (of electromagnetic transponder type) which draw their supply from an electromagnetic field in which they are present (generated by a terminal).

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. A circuit for reading from an electronic charge retention element for a time measurement, of the type comprising at least one capacitive element with a dielectric exhibiting a leakage and a transistor with an isolated control terminal for reading residual charges, comprising:
    first and second parallel branches between two power supply terminals, each branch comprising at least one transistor of a first type and at least one transistor of a second type, a first transistor of the second type of the first branch being the transistor with the isolated terminal and configured to read the charge retention element, and a first transistor of the second type of the second branch receiving, on its control terminal, a stepped signal, wherein
    the respective drains of the transistors of the first type are connected to the respective inputs of a comparator having its output providing an indication of the residual voltage level in the charge retention element, and wherein
    each branch comprises a second transistor of the second type having its control terminals connected at the output of an amplifier of application of a reference voltage, said voltage being also applied on a conduction terminal of the transistor with the isolated terminal.

2. The circuit of claim 1, wherein the conduction terminal of the transistor with the isolated terminal is connected to a negative input of the amplifier.

3. The circuit of claim 1, wherein a reference terminal of the capacitive element of the charge retention element to be read from is connectable to a reference terminal of a second reference charge retention element.

4. The circuit of claim 1, wherein said stepped signal is provided by a digital-to-analog converter of non-linear type.

5. The circuit of claim 4, wherein a voltage reference value of the digital-to-analog converter corresponds to $Q(r)/(k*C_T)$, where k represents the maximum count of the converter, $Q(r)$ represents the initial charge of the retention circuit, and $C_T$ represents its capacitance.

6. The read circuit of claim 4, wherein a weighting coefficient of a count provided by the converter is deduced from an initial measurement from a known time interval.

7. A circuit for reading an electronic charge retention element, the circuit comprising:
    a first transistor of a first type having an isolated control terminal connected to a charge retention element and the first transistor having conduction terminals connected in a first branch of two parallel circuit branches, each branch configured to be connected between two supply terminals;
    a second transistor of the first type having conduction terminals connected in a second branch of the two parallel branches;
    a third transistor of the first type having conduction terminals connected in the first branch; and
    an amplifier configured to receive a voltage reference at a first input and to receive a signal from a conduction terminal of the first transistor at a second input, and having an output connected to control terminals of the second and third transistors.

8. The circuit of claim 7, wherein the charge retention element is configured to provide a signal representative of an elapsed time from an initial charge state of the charge retention element.

9. The circuit of claim 7, further comprising a fourth transistor having its conduction terminals connected in the second branch and a control terminal configured to receive a stepped signal.

10. The circuit of claim 9, further comprising a comparator having a first input connected to a conduction terminal of the second transistor and a second input connected to a conduction terminal of the third transistor.

11. The circuit of claim 10, further comprising a digital-to-analog converter configured to provide the stepped signal to the control terminal of the fourth transistor and to provide an output from a counter.

12. The circuit of claim 11, wherein the comparator is further configured to select an output from the counter representative of the elapsed time.

13. The circuit of claim 7, wherein the charge retention element comprises a first capacitive element with a dielectric exhibiting leakage of charge.

14. The circuit of claim 13, wherein the first capacitive element is configured to be set at an initial charge state by electron injection in a second capacitive element coupled to the first capacitive element.

15. A method for determining an elapsed time with a circuit, the method comprising:
    sensing, at a control terminal of a first transistor of a first type, a signal representative of charge retained in a charge retention element, the first transistor having an isolated control terminal connected to the charge retention element and the first transistor having conduction terminals connected in a first branch of two parallel circuit branches, each branch connected between two supply terminals;
    controlling the control terminals of a second transistor and a third transistor of the first type with the output of an amplifier, the amplifier receiving a voltage reference at a first input and receiving a signal from a conduction terminal of the first transistor at a second input,
    wherein the second transistor has conduction terminals connected in the first branch and the third transistor has conduction terminals connected in a second branch of the two parallel circuit branches.

16. The method of claim 15, wherein the charge retention element comprises a first capacitive element with a dielectric exhibiting leakage of charge.

17. The method of claim 16, wherein the capacitive element is configured to be set at an initial charge state by electron injection in a second capacitive element coupled to the first capacitive element.

18. The method of claim 15, further comprising:
comparing, at a comparator, a first comparison signal from a conduction terminal of the second transistor and a second comparison signal from a conduction terminal of the third transistor; and
providing a stepped input signal to a control terminal of a fourth transistor, the fourth transistor having conduction terminals connected in the second branch.

19. The method of claim 18, wherein the stepped signal is provided by a digital-to-analog converter.

20. The method of claim 19, further comprising selecting a count value representative of an elapsed time from an initial charge state of the charge retention element, the selecting responsive to the comparing of the first and second comparison signals, and the count value provided by the digital-to-analog converter.

21. A circuit for determining an elapsed time comprising:
a first transistor of a first type having its control terminal connected to a charge retention element, the charge retention element including a first capacitive element with a leaky dielectric;
a second transistor of the first type having its control terminal configured to receive a stepped input from a digital-to-analog converter;
means for selecting a counter value from the digital-to-analog converter that is representative of a retained charge in the first capacitive element after a time elapsed from an initial charge state of the first capacitive element.

22. The circuit of claim 21, wherein the first capacitive element is configured to be set at an initial charge state by electron injection in a second capacitive element coupled to the first capacitive element.

23. The circuit of claim 21, wherein the means for selecting comprises an amplifier that is configured to receive at a first input a reference voltage and to receive at a second input a signal from a conduction terminal of the first transistor.

24. The circuit of claim 21, wherein the means for selecting further comprises a comparator configured to select the counter value based upon a comparison of a first signal at a first node coupled to a conduction terminal of the first transistor and a second signal at a second node coupled to a conduction terminal of the second transistor.

* * * * *